United States Patent [19]

Ushirogouchi et al.

[11] Patent Number: 5,691,101
[45] Date of Patent: Nov. 25, 1997

[54] PHOTOSENSITIVE COMPOSITION

[75] Inventors: Toru Ushirogouchi, Yokohama; Naomi Shida, Kawasaki; Takuya Naito, Tokyo; Koji Asakawa, Kawasaki; Akinori Hongu; Makoto Nakase, both of Tokyo; Hirokazu Niki, Yokohama, all of Japan

[73] Assignee: Kabushiki Kaisha Toshiba, Kawasaki, Japan

[21] Appl. No.: 644,395

[22] Filed: May 9, 1996

Related U.S. Application Data

[63] Continuation of Ser. No. 402,358, Mar. 13, 1995, abandoned.

[30] Foreign Application Priority Data

Mar. 15, 1994 [JP] Japan .................................. 6-043623
Nov. 16, 1994 [JP] Japan .................................. 6-281805

[51] Int. Cl.$^6$ ............................ G03F 7/021; G03F 7/023
[52] U.S. Cl. ..................... 430/176; 430/191; 430/192; 430/270.1; 430/286.1; 430/287.1; 430/906; 430/909; 430/910
[58] Field of Search ..................... 430/170, 176, 430/270.1, 191, 192, 177, 171, 286.1, 287.1, 906, 909, 910

[56] References Cited

U.S. PATENT DOCUMENTS

| | | | |
|---|---|---|---|
| 4,401,743 | 8/1983 | Incremona | 430/176 |
| 4,853,314 | 8/1989 | Ruckert et al. | 430/270.1 |
| 5,262,270 | 11/1993 | Walls | 430/176 |
| 5,275,907 | 1/1994 | Walls | 430/176 |
| 5,350,660 | 9/1994 | Urano et al. | 430/170 |

FOREIGN PATENT DOCUMENTS

| | | |
|---|---|---|
| 63-172711 | 7/1988 | Japan . |
| 1-233443 | 9/1989 | Japan . |

*Primary Examiner*—John S. Chu
*Attorney, Agent, or Firm*—Oblon, Spivak, McClelland, Maier & Neustadt, P.C.

[57] ABSTRACT

Disclosed are a safe slurry photosensitive composition superior in image formation capabilities such as resolution and sensitivity and containing no harmful compound, and a safe water-soluble photosensitive composition capable of being dissolved in water without using any organic solvent while maintaining a sufficient sensitivity as a resist and containing no harmful substance. The slurry photosensitive composition contains a compound which generates an acid when irradiated with light or ionizing radiation, at least one type of a resin with acid-crosslinkability or acid-decomposability, and a powder. Various devices can be manufactured by forming a layer of this photosensitive composition on a substrate, exposing the layer to light in accordance with a desired pattern, and heating the layer. The water-soluble photosensitive composition contains a compound which generates an acid when irradiated with light or ionizing radiation, and an acetal resin. This water-soluble photosensitive composition is coated on a substrate and irradiated with light or ionizing radiation in accordance with a desired pattern. The resultant substrate is chemically amplified by heating and developed with water. This makes it possible to safely form a pattern without using any ventilator.

7 Claims, No Drawings

PHOTOSENSITIVE COMPOSITION

This application is a Continuation of application Ser. No. 08/402,358, filed on Mar. 13, 1995, now abandoned.

BACKGROUND OF THE INVENTION

1. Field of the Invention

The present invention relates to a safe photosensitive composition not containing any harmful compound and, more particularly, to a photosensitive compound suitably usable in the manufacture of, e.g., a display device or an image pickup device and a method of manufacturing a display device or an image pickup device using this photosensitive composition. The present invention also relates to a safe photosensitive composition suitably usable in the fabrication of various electronic parts or circuit boards requiring finer processing and a pattern formation method using this photosensitive composition.

2. Description of the Related Art

Conventionally, resists have been widely used in the formation of patterns in the fabrication of various electronic parts or circuit boards, including semiconductor integrated circuits such as LSIs, which require a number of micropatterning techniques, or in the manufacture of display devices such as CRTs and LCDs, or image pickup devices such as CCDs.

Representative examples of the resists used in the micropatterning are resists containing acrylic resin, e.g., poly (methylmethacrylate) and poly(trifluoroethyl-α-chloroacrylate), resists containing quinonediazide-novolak resin and currently beginning to be used in the mass production of LSIs, and chemical amplification type resists consisting of an alkali-soluble resin, a dissolution inhibitor, and an acid generator as disclosed in Jpn. Pat. Appln. KOKAI Publication No. 63-27829. It is unfortunate that any of these resists has a problem in safety since the resist is generally dissolved in an organic solvent to prepare a resist solution by which a coating film is formed. Therefore, a coater must be equipped with a local ventilating means.

On the other hand, a water-soluble resist which can be coated in the form of an aqueous solution and developed with water is also known. One example of this water-soluble resist is a photosensitive composition using ammon dichromate or a large quantity of a diazo compound, as a sensitizing agent, and also containing casein or polyvinyl alcohol as a water-soluble resin. Unfortunately, ammon dichromate is a special management substance having toxicity, and a large quantity of a diazo compound is also very harmful to a human body. Consequently, this photosensitive resin also has problems in safety and environmental pollution.

Of the resists enumerated above, those used as the resists in the manufacture of display devices or image pickup devices are a mixture of ammon dichromate or a bisazide compound and a water-soluble resist, and a resist containing photosensitive polyimide or a quinonediazide-novolak resin. These resists, therefore, have the same problems as the resists used in the micropatterning.

In addition to these resists, a so-called slurry photosensitive composition is known as a light-controlling resist playing a certain role in achieving the performance of a photo-related device, e.g., a fluorescent resist of a CRT, or a light-shielding resist or a color filter resist of a display device or an image pickup device. This slurry photosensitive composition contains a powder of, e.g., a fluorescent substance, a dye, or a pigment and is thereby imparted the corresponding function of any of these materials. However, this powder as the component of the slurry photosensitive composition scatters or absorbs exposure light, resulting in a significantly decreased transparency of the resist. This consequently degrades the image formation capabilities such as resolution and sensitivity.

SUMMARY OF THE INVENTION

It is an object of the present invention to provide two types of photosensitive compositions. The first photosensitive composition is a safe slurry photosensitive composition superior in image formation capabilities such as resolution and sensitivity and containing no harmful compound. The second photosensitive composition is a safe water-soluble photosensitive composition capable of being dissolved in water without using any organic solvent while maintaining a sufficient sensitivity as a resist, and containing no harmful substance.

It is another object of the present invention to provide a method of manufacturing various types of devices, particularly a CRT and an image pickup device, in which the manufacturing process is simplified and therefore high-quality products can be manufactured with a high yield.

It is still another object of the present invention to provide a pattern formation method capable of safely performing the process without using any special equipment such as a ventilator.

The first photosensitive composition of the present invention is characterized by containing i) a compound which generates an acid when irradiated with light or ionizing radiation, ii) at least one type of a resin with acid-crosslinkability or acid-decomposability, and iii) a powder.

The first photosensitive composition is a safe slurry photosensitive composition not containing any harmful substance such as a large quantity of a bisazide compound or a harmful metal ion. In addition, the image formation capabilities such as the resolution and the sensitivity of the first photosensitive composition are so excellent that they cannot be expected to be achieved in any conventional slurry photosensitive composition inferior in the resist transparency or the sensitivity during exposure.

The second photosensitive composition of the present invention is characterized by containing i) a compound which generates an acid when irradiated with light or ionizing radiation, and ii) at least one type of an acid-crosslinkable resin having repeating units represented by Formulas (1) and (2) below:

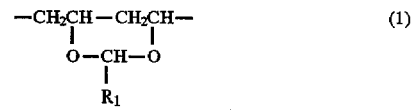 (1)

 (2)

wherein $R_1$ represents a monovalent organic group.

The second photosensitive composition can be dissolved in water without using any organic solvent, contains no or almost no harmful substance, and has a sufficient sensitivity as a negative type and chemical amplification type resist. Consequently, the amount of an additive such as an acid generator can be reduced. Also, the process can be done safely since no special equipment such as a ventilator is required in using this composition.

The device manufacturing method of the present invention is characterized by including the steps of i) forming a layer of the first photosensitive composition on a substrate, ii) exposing the layer in accordance with a predetermined pattern, and iii) heating the layer to form a fine pattern of the powder contained in the photosensitive composition.

This device manufacturing method can directly form a pattern having an optical function, unlike in conventional pattern formation methods. Consequently, the manufacturing process can be simplified. As a result, defective portions, such as defects of the pattern, produced during the manufacturing process can be reduced, and this makes it possible to manufacture high-quality products with a high yield.

The pattern formation method of the present invention is characterized by comprising the steps of i) coating the second photosensitive composition on a substrate, ii) irradiating light or ionizing radiation on the substrate coated with the photosensitive composition in accordance with a predetermined pattern, iii) performing chemical amplification by heating the irradiated substrate, and iv) developing the chemically amplified substrate with water.

In this method the pattern formation can be safely performed without requiring any special equipment such as a ventilator.

DETAILED DESCRIPTION OF THE PREFERED EMBODIMENTS

The first photosensitive composition of the present invention, i.e., a safe slurry photosensitive composition superior in image formation capabilities such as resolution and sensitivity and containing no harmful compound will be described below.

Examples of a compound which generates an acid upon irradiation with light, i.e., an acid generator, and is preferably water-soluble for use in the first photosensitive composition of the present invention are an onium salt, a quinonediazide compound (particularly orthoquinonediazides), and an organic halide.

Specific examples of the onium salt are diazonium salts, phosphonium salts, and sulfonium salts having fluoroborate anion, hexafluoroantimonate anion, hexafluoroarsenate anion, trifluoromethanesulfonate anion, paratoluenesulfonate anion, and paranitrotoluenesulfonate anion, as counterions.

As the quinonediazide compound, salts of naphthoquinonediazidosulfonylchloride and naphthoquinonediazidosulfonic acid can be suitably used.

The organic halide means a compound which forms hydrohalogenic acid. Examples are the compounds described in U.S. Pat. Nos. 3,515,552, 3,536,489, and 3,779,778 and West German Patent No. 2,243,621. More specifically, examples of the organic halide are the compounds described in U.S. Pat. No. 3,515,552, i.e., carbontetrabromide, tetra(bromomethyl)methane, tetrabromoethylene, 1,2,3,4-tetrabromobutane, trichloroethoxyethanol, p-iodophenol, p-bromophenol, p-iodobiphenyl, 2,6-dibromophenol, 1-bromo-2-naphthol, p-bromoaniline, hexachloro-p-xylene, trichloro-acetanilide, p-bromodimethylaniline, tetrachlorotetrahydronaphthalene, α,α'-dibromoxylene, α,α,α',α'-tetrabromoxylene, hexabromoethane, 1-chloroanthraquinone, ω,ω,ω-tribromoquinalidine, hexabromocyclohexane, 9-bromofluorene, bis(pentachloro)cyclopentadiphenyl, polyvinylidenechloride, and 2,4,6-trichlorophenoxyethylvinylether; and the compounds described in U.S. Pat. No. 3,779,778, i.e., hexabromoethane, α,α,α-trichloroacetophenone, tribromotrichloroethane, and halomethyl-S-triazines. In particular, halomethyl-S-triazines such as 2,4-bis(trichloromethyl)-6-methyl-S-triazine and 2,4,6-tris(trichloromethyl)-S-triazine are favorable. A more favorable example of the organic halide is the compound disclosed in U.S. Pat. No. 3,987,037, which is substituted with vinylhalomethyl-S-triazine. This vinylhalomethyl-S-triazine compound is a photo-decomposable S-triazine having at least one trihalomethyl group and a group which conjugates with a triazine ring via at least one ethylenic unsaturated bond. The compound is represented by Formula (A) below:

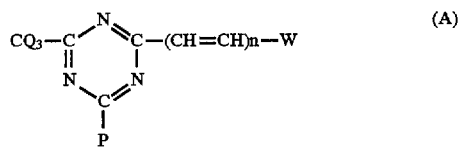

wherein Q represents bromine or chlorine, P represents $-CQ_3$, $-NH_2$, $-NHR$, $-NR_2$, or $-OR$, R represents phenyl or a lower alkyl group having 6 or less carbon atoms, n represents 1, 2, or 3, W represents an aromatic ring, a heterocyclic ring, or a group represented by Formula (B) below:

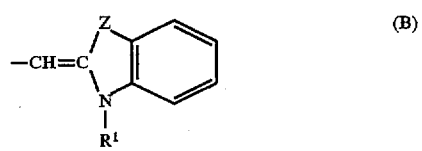

wherein Z represents oxygen or sulfur, and $R^1$ represents a lower alkyl group or a phenyl group.

In Formula (A), the aromatic ring or the heterocyclic ring represented by W can be further substituted. Examples of the substituent are chlorine, bromine, phenyl, a lower alkyl group having 6 or less carbon atoms, nitro, phenoxy, alkoxy, acetoxy, acetyl, amino, and alkylamino.

Practical examples of the vinylhalomethyl-S-triazine compound represented by Formula (A) are the following compounds.

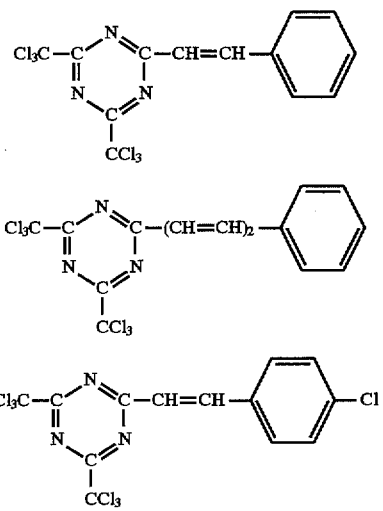

-continued

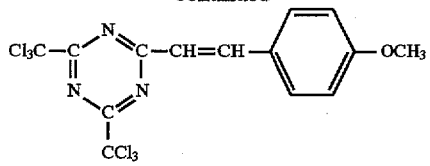
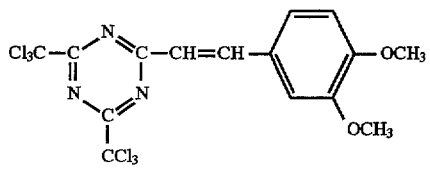
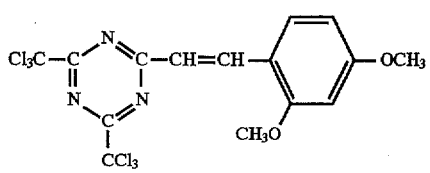
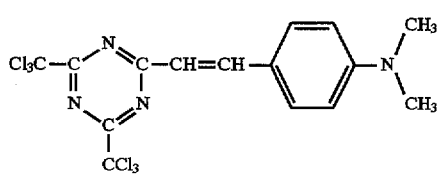
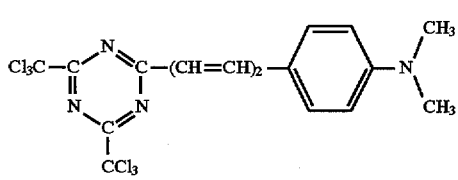
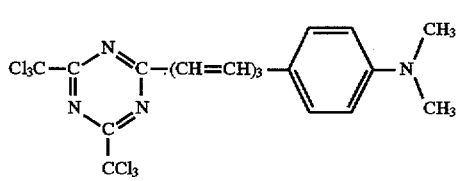
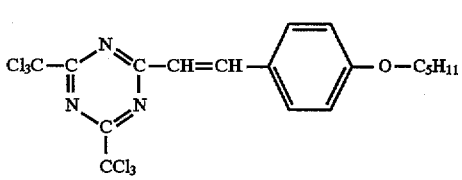
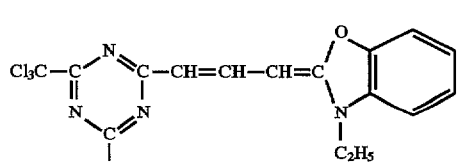
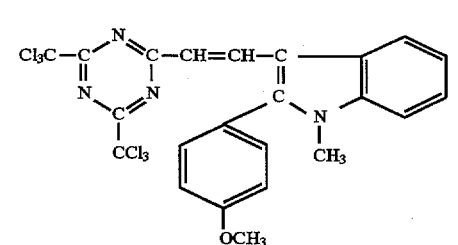

-continued

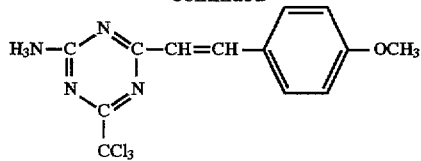

Of the acid generators enumerated above, diazonium salts presented below are particularly preferable in that they dissolve well in water and have a high sensitivity to ultraviolet radiation.

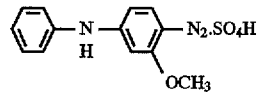
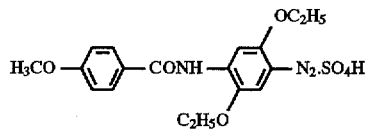
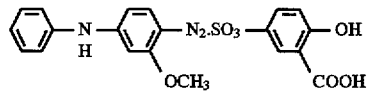
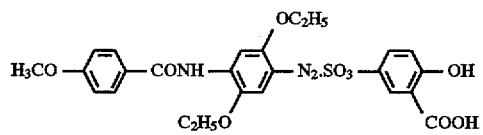
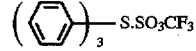

In the first photosensitive composition of the present invention, the mixing amount of the acid generator is not unconditionally defined because the amount depends upon the acid generation efficiency of the compound. However, the mixing amount is usually 0.01 to 20 parts by weight with respect to the total solid content, and preferably 0.2 to 10 parts by weight from the point of view of safety. If the mixing amount is smaller than 0.01 part by weight, it is difficult to obtain satisfactory effect of the mixing. If the mixing amount is larger than 20 parts by weight, the coating property, the safety, and the like factor may be degraded.

The first photosensitive composition of the present invention uses either a resin with acid-crosslinkability or a resin with acid-decomposability. when the acid-crosslinkable resin is used, the resultant photosensitive composition is a negative resist. When the acid-decomposable resin is used, a positive resist results.

Examples of the acid-crosslinkable resin are a homopolymer and a copolymer of vinyl alcohol; a copolymer of maleic anhydride; polyvinyl alcohol which is acetalized by, e.g., an aldehyde having a double bond; resins such as casein and cellulose having an OH group, a COOH group, or an acetal group with acid reactivity and a dehydration condensation property; a copolymer of polyamic acid, polyamino acid, or acrylic acid and a vinyl compound having a double bond on the side chain; a copolymer of vinyl alcohol and a vinyl compound having a double bond on the side chain; a melamine resin converted into methylol; an acrylic copolymer having a double bond on the side chain; an acrylic copolymer containing an epoxy group such as glycidylmethacrylate; a polymer having a double bond including a group such as allylether or ethylvinylether; an epoxy resin;

an epoxy resin which is modified to be alkali-soluble with acrylic acid or a carboxylic acid derivative; and a phenolic resin, such as a novolak resin, mixed with polyether, acetal, enolether, or acyliminocarbonate.

Of these resins, those having a carbonyl group or a phenolic hydroxyl group in the structure are more desirable since aqueous development is possible with these resins.

Also, of these resins an acetal resin having repeating units represented by Formulas (1) and (2) below is particularly preferable because of its high adhesion to a powder:

 (2)

wherein  represents a monovalent organic group.

In Formula (1), examples of the monovalent organic group represented by $R_1$ are an alkyl group, an alkyl group containing a carboxyl group, an aromatic ring, and an aromatic ring having a substituent group.

The acetal resin containing repeating units represented by Formulas (1) and (2) can be obtained by, e.g., reacting polyvinyl alcohol with an aldehyde having a substituent represented by $R_1$, in the presence of a catalyst such as an acid catalyst, thereby acetalizing the polyvinyl alcohol, i.e., converting the polyvinyl alcohol into the acetal. Examples of the aldehyde having a substituent represented by $R_1$ are formaldehyde, acetaldehyde, propionaldehyde, butylaldehyde, isobutylaldehyde, valeraldehyde, isovaleraldehyde, hexanal, heptamal, octanal, nonanal, decanal, paraformaldehyde, acrylaldehyde, methacrolein, crotonaldehyde, methacrylaldehyde, 2-methyl-2-butenal, propiolaldehyde, 2-butynal, chloroacetaldehyde, dichloroacetaldehyde, chloral, bromal, butylchloral, glycolaldehyde, lactoaldehyde, aldol, glyceraldehyde, glyoxylic acid, benzaldehyde, naphthoaldehyde, hydroxybenzaldehyde, and aldehyde crotonate.

In the acetal resin containing the repeating units represented by Formulas (1) and (2), the total amount of the repeating unit represented by Formula (1) is preferably 1 to 20 wt % of the entire resin. If the amount falls outside this range, the resultant photosensitive composition tends to degrade in, e.g., the sensitivity, the ratio of the residual film after exposure, and the solubility in water. The total amount of the repeating unit represented by Formula (2) is preferably 50 to 99 wt % of the entire resin. If the amount falls outside this range, the solubility of the resultant photosensitive composition upon water development decreases in some cases.

The molecular weight of the acetal resin containing the repeating units represented by Formulas (1) and (2) is preferably 1,000 to 300,000 as a weight-average molecular weight (Mw). If the molecular weight falls outside this range, the sensitivity or the solubility in an aqueous solvent may degrade.

Polyvinyl alcohol used as the material of this acetal resin is generally mass-produced by using vinyl acetate as a raw material. In the preparation of the acetal resin for use in the present invention, an unreacted portion of vinyl acetate can remain in polyvinyl alcohol. This unreacted portion of vinyl acetate, however, decreases the solubility of the resultant acetal resin in water. Therefore, the remaining amount of the unreacted portion is preferably 10 wt % or less of the entire resin.

These acid-crosslinkable resins can be used either singly or in the form of a mixture of two or more types of them. The resins can also be used in the form of a mixture with polyvinyl alcohol as a common water-soluble polymer, casein, or polysaccharides.

Examples of the acid-decomposable resin are a copolymer of tert-butylmethacrylate and methacrylic acid; a polyvinyl acetal resin with a high acetalization ratio; a resin crosslinked by vinyl ethanol; a resin having a tert-butyl group or a tert-butylester group, e.g., a tert-butoxycarbonylated hydroxystyrene or novolak resin, a tert-butylcarbonylmethylated hydroxystyrene or novolak resin, and a tert-butylated hydroxystyrene or novolak resin; and a trimethylsilylated phenolic resin. Of these resins, those having a carbonyl group or a phenolic hydroxyl group in the structure are more desirable in that aqueous development is possible with these resins. These resins can be used singly or in the form of a mixture of two or more types of them. It is also possible to use the resins in the form of a mixture with resins of other sorts.

In the first photosensitive composition of the present invention, the content of these resin components is desirably 10 to 95 wt % of the total solid content in the composition. If the content is less than 10 wt %, the resolution or the sensitivity may degrade. If the content exceeds 95 wt %, the image formation capability may degrade.

As the powder contained in the first photosensitive composition of the present invention, a powder of a compound having an optical function such as a fluorescing property or a light shielding property or a powder of a compound having the function of an optical filter can be suitably used as, e.g., a fluorescent substance, a dye, or a pigment. It is also possible to use a powder of a compound capable of improving the heat resistance or the strength as a structural material.

As the compound having a fluorescing property discussed above, either an inorganic or organic fluorescing compound can be used. As the inorganic fluorescing compound, it is possible to use salts normally used in fluorescent paints, fluorescent lamps, fluorescent substances for CRT, and pigments. Practical examples are inorganic acid salts such as $MgWO_4$, $CaWO_4$, $(Ca,Zn)(PO_4)_2{:}Ti^+$, $Ba_2P_2O_7{:}Ti$, $BaSi_2O_5{:}Pb^{2+}$, $Sr_2P_2O_7{:}Sn^{2+}$, $SrFB_2O_{3.5}{:}Eu^{2+}$, $MgAl_{16}O_{27}{:}Eu^{2+}$, tungstate, and sulfate. Examples of the organic fluorescing compound are Acridine Orange, aminoacridine, quinacrine, an anilinonaphthalenesulfonic acid derivative, anthroyloxystearic acid, Auramine O, chlorotetracycline, cyanine dyes such as merocyanine and 1,1'-dihexyl-2,2'-oxacarbocyanine, dansylchloride derivatives such as dansylsulfoamide, dansylcholine, dansylgalacside, dansyltrizine, and dansylchloride, diphenylhexatriene, eosine, ε-adenosine, ethidiumbromide, fluorescein, formycine, 4-benzoylamido-4'-aminostilbene-2, 2'-sulfonic acid, β-naphthyl triphosphoric acid, an oxonol dye, a parinaric acid derivative, perillene, N-phenylnaphthylamine, pyrene, Safranine O, fluorescamine, fluoresceinisocyanate, 7-chloronitrobenzo-2-oxa-1,3-diazol, dansyladilizine, 5-(iodoacetamidoethyl) aminonaphthalene-1-sulfonic acid, 5-iodoacetamidofluorescein, N-(1-anilinonaphthyl 4)maleimide, N-(7-dimethyl-4-methylcoumanyl)maleimide, N-(3-pyrene)maleimide, eosine-5-iodoacetamide, fluoresceinmercuryacetate, 2-[4'-(2"-iodoacetamide)] aminonaphthalene-6-sulfonic acid, and a Rhodamine derivative.

One example of the powder of a compound having a light shielding property is a light-absorbing pigment. Practical examples are carbon pigments such as carbon black, carbon refined, and carbon nanotube; metal oxide pigments such as iron black, cobalt blue, zinc oxide, titanium oxide, and chromium oxide; sulfide pigments such as zinc sulfide; phthalocyanine pigments; sulfates, carbonates, silicates, and phosphates of metals; and an aluminum powder, a bronze powder, and a zinc powder. Examples of the organic pigment are nitroso pigments such as Naphthol Green B; nitro pigments; azo and azolake pigments such as Bordeaux 10B, Lake Red 4R, and chromophthal red; lake pigments such as Peacock Blue Lake, and Rhodamine Lake; phthalocyanine pigments such as Phthalocyanine Blue; threne pigments such as Thioindigo red and Indanthrene Blue; quinacridone pigments; quinacridine pigments; and isoindolinone pigments. In addition to these pigments, the first photosensitive composition may also contain dyes in order to increase the absorbance.

Examples of the heat-resistant structural material are oxides and nitrides of aluminum and silicon, a filler, silicon carbide, and carbon fiber.

In the first photosensitive composition of the present invention, the content of these powder components is desirably 1 to 98 wt % of the total solid component in the composition. If the content is smaller than 1 wt %, satisfactory addition effect, such as optical effects, can not be obtained. On the other hand, a content larger than 98 wt % may degrade the resolution or the sensitivity.

It is also desirable that the average particle size of these powders be as small as possible. The average particle size is normally ⅓ or less of the size of a pattern to be formed, and preferably 100 μm or smaller.

In addition to the three components described above, the first photosensitive composition of the present invention may also contain a water-soluble, photo-crosslinking agent, such as bisazide, as the fourth component. Furthermore, in addition to these components the composition may contain an additive in an amount by which the effect of the present invention is not degraded. One example of the additive is a sensitizer of the acid generator, such as a squalium dye, which is sensitive to a specific wavelength, particularly 340 nm or higher. It is also possible, where necessary, to add a dispersant of a powder, such as a nonionic or ionic surfactant or an electrification agent.

Generally, the first photosensitive composition of the present invention is dissolved in water or an organic solvent before being used. From the point of view of safety, the use of a water as a solvent is preferred. In this case it is possible to add an alcohol solvent, such as ethanol or propanol, to the extent to which the safety is not degraded, in order to prevent gelation of the composition. Additionally, if a coater capable of local ventilation is used, freer copolymer compositions are possible by the use of an organic solvent such as cyclohexanone.

As will be discussed later, the image formation capability of the first photosensitive composition of the present invention depends upon the chemical amplification mechanism. That is, an acid is generated by the acid generator upon exposure, and when heated this acid diffuses to function as a catalyst of a crosslinking reaction or a decomposition reaction. For this reason, in this composition even a slight amount of basic ion causes a decrease in the sensitivity. Therefore, a care must be taken so that no basic ion is mixed not only during the composition preparation process but also during the manufacturing process of each component to be contained in the composition.

The first photosensitive composition of the present invention can be suitably used in the manufacture of display devices, such as CRTs or liquid crystal devices, or image pickup devices. In particular, the composition largely contributes to the formation of patterns having optical functions of these devices.

A method of forming a fluorescent pattern using the first photosensitive composition of the present invention will be described below by taking a CRT as an example.

First, an aqueous solution of the first photosensitive composition of the present invention or a slurry solution prepared by adding a small amount of alcohol to this aqueous solution is coated on a CRT in which a light-shielding portion is already formed. The coated solution is blown with hot air at 50° to 120° C. or heated and dried on a heating means such as a hot plate, thereby forming a resist layer. Although the thickness of this resist layer depends upon the application, it usually ranges between 5 and 25 μm in the case of a CRT. If the thickness falls outside this range, the fluorescence intensity or the resolution may decrease. Thereafter, the resist layer is exposed to exposure ray passed through a shadow mask. As exposure rays used in the exposure, ultraviolet radiation (wavelength=430 nm to 250 nm) generated by a high- or low-pressure mercury lamp is desirable since the light source is highly versatile and easy to use. The exposure amount is normally one millijoule to 1000 millijoules/unit $cm^2$. After the exposure, post exposure baking is performed at 60° to 150° C. A pattern is then formed by developing the resist layer with an appropriate developer such as water. If the solubility in the developer is low, an alkali can be added to the developer. In the case of a CRT, the above pattern formation process is repeated three times for three fluorescent colors, R, G, and B. After all patterns are formed, aluminum is vapor-deposited on the rear surface to give the surface conductivity, and then tube sealing and removal of organic substances by heating are carried out. Thereafter, vacuum electrode sealing is performed to complete the CRT.

A method of forming a light-shielding pattern using the first photosensitive composition of the present invention will be described below by taking an LCD device as an example.

First, an aqueous solution of the first photosensitive composition of the present invention or a slurry solution prepared by adding a small amount of alcohol to this aqueous solution is coated on an LCD substrate on which a TFT element portion, such as an indium-tin-oxide (ITO) electrode or a data metal line, and a protective film are already formed. The coated solution is blown with hot air at 50° to 120° C. or heated and dried on a heating means such as a hot plate, thereby forming a resist layer. Although the thickness of this resist layer depends upon the application, it usually ranges between 0.5 and 1.5 μm in the case of an LCD substrate. If the thickness falls outside this range, the light-shielding performance or the resolution may decrease. Thereafter, the resist layer is exposed to have a light-shielding pattern to be arranged between the elements through a mask. As exposure rays used in the exposure, ultraviolet radiation such as the g line or i line of a mercury lamp is commonly used. The exposure amount is normally several ten millijoules to several hundred millijoules/unit $cm^2$. After the exposure, post exposure baking is performed at 60° to 150° C. A pattern is then formed by developing the resist layer with an appropriate developer such as water. If the solubility in the developer is low, an alkali can be added to the developer. After the pattern is formed as above, cell assembling and liquid crystal sealing are performed to complete the LCD device.

The first photosensitive composition of the present invention is a chemical amplification type resist. That is, an acid generated from the acid generator at the resist surface portion upon exposure is diffused vertically in the resist layer by heating. This acid acts as a catalyst for a crosslinking reaction or a decomposition reaction. If an acid-crosslinkable resin is contained in the composition, a negative pattern is formed. If an acid-decomposable resin is contained in the composition, a positive pattern is formed. As discussed earlier, this first photosensitive composition contains a powder. In conventional powder-containing photosensitive compositions, a portion which remains unirradiated with light exists on the back side of each powder particle, leading to deterioration in the sensitivity or the resolution. In the first photosensitive composition of the present invention, however, the acid catalyst penetrates by diffusion to the back side of each powder particle to which no light reaches. This makes it possible to efficiently bring about the crosslinking reaction or the decomposition reaction.

The second photosensitive composition of the present invention, i.e., a safe water-soluble photosensitive composition capable of being dissolved in water in the absence of an organic solvent while maintaining a sufficient sensitivity as a resist, and not containing any harmful substance will be described in detail below.

As mentioned earlier, the second photosensitive composition of the present invention contains i) a compound which generates an acid when irradiated with light or ionizing radiation, and ii) at least one type of an acid-crosslinkable resin having repeating units represented by Formulas (1) and (2).

Of these components, the acid-crosslinkable resin having the repeating units represented by Formulas (1) and (2) is identical with the acetal resin having the repeating units represented by Formulas (1) and (2), which is discussed in detail in the explanation of the first photosensitive composition. Also, the repeating unit total amount, the mixing amount, and the molecular weight of the resin are the same as those explained for the first photosensitive composition.

In the second photosensitive composition of the present invention, as the compound which generates an acid when irradiated with light or ionizing radiation, i.e., the acid generator, the compounds enumerated above as the acid generators usable in the first photosensitive composition can be directly used. In particular, diazonium salts represented by Formulas (3) to (5) below are preferable since each salt has a high solubility in water and a high sensitivity to ultraviolet radiation.

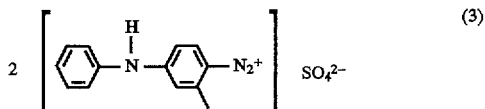
(3)

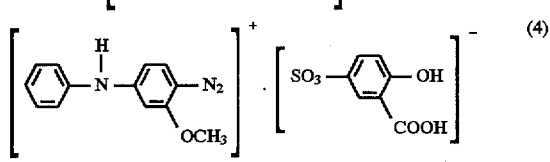
(4)

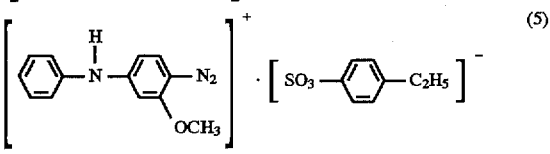
(5)

The mixing amount and the like factor of the acid generator are the same as those of the acid generator used in the first photosensitive composition.

In addition to the above components, the second photosensitive composition of the present invention may contain an additive in an amount by which the effect of the present invention is not impaired. Examples of the additive are a water-soluble, acid-crosslinkable compound and a sensitizer of the acid generator, which is sensitive to a specific wavelength, particularly 340 nm or higher. More specifically, examples of the watersoluble, acid-crosslinkable compound are a melamine resin and a modified epoxy resin formed by conjugating a vinyl compound having carboxylic acid to an epoxy resin. A squalium dye is one example of the sensitizer of the acid generator.

When used as a resist, this second photosensitive composition functions as a negative resist in which a portion irradiated with light or ionizing radiation hardens. Although the mechanism of this reaction is uncertain, it is considered that the acid generated upon irradiation with light or ionizing radiation acts as a catalyst to improve efficiency of the reactions indicated by Reaction Formulas (I) and (II) below.

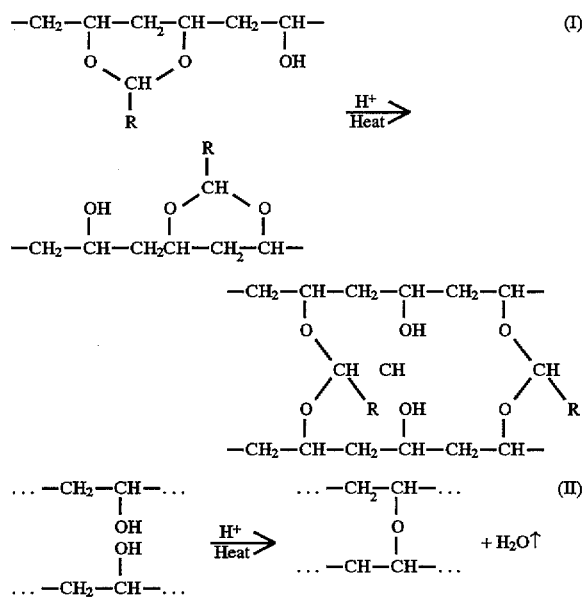

The second photosensitive composition of the present invention is also a so-called chemical amplification type photosensitive composition containing a compound which generates an acid when irradiated with light or ionizing radiation. As discussed earlier, a photosensitive composition of this type makes use of the chemical amplification mechanism in which an acid is generated from the acid generator upon exposure with light or ionizing radiation and diffused by heating, and this acid acts as a catalyst to bring about a crosslinking reaction. As with the first photosensitive composition, therefore, the presence of a basic ion interferes with the crosslinking reaction, leading to a decrease in the sensitivity.

The water-soluble resin as the main component of the second photosensitive composition is an acetal-modified resin derivable from polyvinyl alcohol as described above. Generally, metal ions are mixed in polyvinyl alcohol during the manufacturing process. Consequently, a slight amount of metal ion is also contained in the acetal-modified resin as the product. A counter-ion of this metal ion deactivates an acid which plays an important role in the chemical amplification mechanism. This significantly decreases the sensitivity of the photosensitive composition which uses the chemical amplification mechanism. Therefore, any conventional chemical amplification type photosensitive composition primarily consisting of such a polyvinyl alcohol-based water-soluble polymer cannot be put into practical use, since it is impossible to fully utilize the sensitivity that the composition originally has.

The present inventors have found that the sensitivity of the chemical amplification type photosensitive composition primarily consisting of a polyvinyl alcohol-based water-soluble polymer is drastically raised by reducing the content of basic ions, particularly metal ions, and thereby the object of the present invention is achieved. That is, a water-soluble photosensitive composition containing i) a water-soluble compound which generates an acid when irradiated with light or ionizing radiation and ii) a polyvinyl alcohol-based water-soluble polymer, in which the content of basic ions in the composition is 1,000 ppm or less with respect to the total solid component, is also included in the scope of the present invention. To distinguish from the second photosensitive composition, this photosensitive composition will sometimes be referred to as a third photosensitive composition hereinafter.

As the water-soluble compound which is contained in this third photosensitive composition and generates an acid when irradiated with light or ionizing radiation, the acid generator used in the first and second photosensitive compositions can be directly used. The polyvinyl alcohol-based water-soluble polymer includes polyvinyl alcohol and modified polyvinyl alcohol derived from polyvinyl alcohol.

If the quantity of basic ions contained in the photosensitive composition is 1,000 ppm or less, for example, as a quantity of metal ions, the composition can have a practical sensitivity. However, the quantity of basic ions is more preferably 500 ppm or less. Generally, the sensitivity of the photosensitive composition can be increased as the quantity of basic ions is decreased. Accordingly, it is possible to decrease the concentration of the acid generator to improve the safety.

In the third photosensitive composition, it is important that not only the acid generator contain less basic ion but the polyvinyl alcohol-based polymer contain less metal ion. As discussed above, polyvinyl alcohol as the material of the polyvinyl alcohol-based polymer contains metal ions mixed during the manufacturing process of the polyvinyl alcohol. Therefore, if this polyvinyl alcohol is used directly, it is impossible to obtain the third photosensitive composition of the present invention, so the content of metal ions must be reduced.

For example, the amount of metal ions contained in the polyvinyl alcohol-based polymer can be reduced by the use of a reagent containing as little metal ions as possible during the manufacturing process of polyvinyl alcohol as the material of the polyvinyl alcohol-based polymer, or by washing the polyvinyl alcohol or the polyvinyl alcohol-based polymer manufactured. More specifically, the metal ion content in the polyvinyl alcohol-based polymer can be reduced by, in manufacturing polyvinyl alcohol by hydrolyzing polyvinyl acetate, performing the hydrolysis by using a volatile acid and removing the acid by repeating decantation and condensation without neutralizing with an alkali, or by washing the polyvinyl alcohol or the polyvinyl alcohol-based polymer thus produced by using a solution such as oxalic acid.

The resin containing the repeating units represented by Formulas (1) and (2) is also a polyvinyl alcohol-based polymer. Therefore, by applying the constitution of this third photosensitive composition to the first and second photosensitive compositions of the present invention, i.e., by reducing the amount of basic ions contained in the first and second photosensitive compositions, the sensitivity can be further increased, and the content of the acid generator can be decreased. This makes it possible to obtain further safe water-soluble photosensitive compositions.

A method of forming a pattern using the second or third photosensitive composition will be described below.

First, a resist solution, i.e., an aqueous solution of the photosensitive composition or an aqueous solution added with a small amount of alcohol is prepared. The prepared resist solution is coated on a substrate, and the solvent of the resist is vaporized by heating to 50° to 120° C. by using a hot plate or the like. In this case any method commonly performed in this field of art can be used to coat the resist solution on the substrate. Generally, the thickness of the resist layer formed on the substrate after the solvent is vaporized preferably ranges from 0.05 to 25 µm, although it changes in accordance with the application. If the thickness falls outside this range, the sensitivity may significantly decrease or the resolution may decrease.

Subsequently, exposure is performed by irradiating light or ionizing radiation on the resist layer formed on the substrate in accordance with a desired pattern. As the light or ionizing radiation used in the exposure, ultraviolet radiation, particularly ultraviolet radiation with a wavelength of 340 nm or more is preferable, since the light source is highly versatile and easy to handle.

After the exposure, post exposure baking is performed at a temperature of 60° to 150° C. Consequently, chemical amplification proceeds, and the resist is sensitized.

Lastly, the resist layer is developed with water to form a pattern. During this pattern formation, the solubility in water is in some cases slightly decreased depending on the type of polymer component used in the photosensitive composition, and this slows down the development. If this is the case, a slight amount of alkali can be added to water.

In the above method, a thin hard film also can be formed on the substrate by evenly exposing the entire surface of the resist layer, instead of doing the pattern exposure, and then performing post exposure baking. The film formed in this manner contracts when it is heated after the exposure, bringing about a stretching effect. To obtain this effect, however, the post exposure baking must be done strongly. That is, it is preferable to perform, by using 5 parts by weight or more of the acid generator, exposure with an exposure amount large enough to cause the acid generator to completely react, and heating at a temperature of 140° C. or higher after the exposure. By using the photosensitive composition of the present invention under these conditions, it is also possible to form an orientation film of a liquid crystal device, which can be oriented with light.

The pattern or the thin film formed by the above method by using any one of the first to third photosensitive compositions of the present invention is normally colorless and transparent. However, the pattern or the thin film can also be blackened by decreasing the transparency of the pattern or the film by performing post baking at a high temperature after the development. More specifically, it is only necessary to perform heating at about 140° to 300° C. for 1 to 60 minutes after the development. It is considered that this blackening is caused since an extreme dehydration reaction as indicated by Reaction Formula (III) below proceeds due to the heating at a high temperature and the action of an acid, and this carbonizes the film.

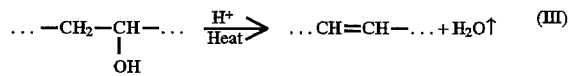

This post baking is preferably performed in an anaerobic atmosphere or a nitrogen atmosphere. It is also possible to enhance the blackening reaction by increasing the concentration of the acid contained in the film by again irradiating the light or the ionizing radiation used in the exposure, or by supplying an acid into the film from a gas phase, a liquid phase, or some other polymeric phase, prior to performing the post baking.

The pattern or the thin film blackened in this way can be suitably used in a light-shielding portion of a display device or of a light-receiving device. The resist layer formed by using any one of the photosensitive compositions of the present invention slightly exhibits conductivity when blackened. Therefore, the blackened pattern can also be used as a slightly conductive pattern.

Examples of the present invention will be described below. It is intended, however, that these examples are to merely explain the present invention, and the present invention is not limited to these examples.

EXAMPLE 1

I) Preparation of Resin Components i) Resin R1

2 g of polyvinyl alcohol (molecular weight 10,000) were dissolved in 30 ml of water. 4.5 ml of concentrated sulfuric acid and 0.05 mol of butanal were added to the solution, and the resultant solution was stirred at 60° C. for 8 hours. After the reaction ceased, the sulfuric acid was neutralized with barium acetate. The resultant solution was subjected to filtration and concentrated under reduced pressure. As a result, a polyvinyl butyral resin with an acetalization degree of 9 mol % was obtained.

ii) Resin R2

2 g of polyvinyl alcohol (molecular weight 10,000) were dissolved in 30 ml of water. 4.5 ml of concentrated sulfuric acid and 0.025 mol of glyoxylic acid were added to the solution, and the resultant solution was stirred at 60° C. for 48 hours. After the reaction, the sulfuric acid was removed by using an ion-exchange resin column, and the resultant solution was concentrated under reduced pressure. As a result, a polyvinyl acetal resin with an acetalization degree of 8 mol % was obtained.

iii) Resins R3–R5

Commercially available polyvinyl alcohol (Gosenol GL-50 (tradename) manufactured by Nippon Gosei Kogyo K.K.) was used as resin R3. A commercially available copolymer (AN-119 manufactured by Gokyo Sangyo K.K.) of methylvinylether and maleic anhydride (1:1) was used as resin R4. A commercially available melamine resin Cymel 325 (manufactured by Mitsui Cyanamide K.K.) was used as resin R5.

iv) Powders P1–P3

Green 226M (available from TOSHIBA CORP.) with an average particle size of 3 μm was used as powder P1. Himicron Black K (available from Mikuni Shikiso K.K.) with an average diameter of 0.1 μm was used as powder P2. Spherical silica (available from TOSHIBA SILICONE CORP.) with an average diameter of 2 μm was used as powder P3. Powder P1 was a fluorescent powder, powder P2 was a light-shielding powder, and powder P3 was a heat-resistant powder.

v) Acid Generators

Acid generators A1 to A5 represented by formulas listed in TABLE 1 below were used. Acid generators A1 and A2 were purchased from Lespechemical Corp., and acid generator A5 was purchased from Midori Kagaku K.K. Acid generators A3 and A4 were formed by using acid generators A1 and A2, respectively, as the starting materials and ion-exchanging the sulfate portion in accordance with the following method. First, acid generator A1 was dissolved in water, and an excess amount of sulfosalicylic acid was added. The reaction solution was concentrated and cooled, and the precipitated crystal was recovered by filtration. In this manner, acid generator A3 was obtained. Acid generator A4 was formed following the same procedure as above by using acid generator A2 as the starting material.

TABLE 1

| Symbol | Structure |
| --- | --- |
| A1 | Ph—NH—C$_6$H$_3$(OCH$_3$)—N$_2$.SO$_4$H |
| A2 | H$_3$CO—C$_6$H$_4$—CONH—C$_6$H$_2$(OC$_2$H$_5$)(C$_2$H$_5$O)—N$_2$.SO$_4$H |
| A3 | Ph—NH—C$_6$H$_3$(OCH$_3$)—N$_2$.SO$_3$—C$_6$H$_3$(OH)(COOH) |
| A4 | H$_3$CO—C$_6$H$_4$—CONH—C$_6$H$_2$(OC$_2$H$_5$)(C$_2$H$_5$O)—N$_2$.SO$_3$—C$_6$H$_3$(OH)(COOH) |
| A5 | (Ph)$_3$—S.SO$_3$CF$_3$ |

II) Preparation of Resist Solutions

Solid contents having compositions listed in TABLE 2 below were dissolved in equal amounts of water. The powder components were dispersed by stirring to prepare solutions of resists 1 to 8.

TABLE 2

| Resist No. | Resin | Photo-acid generator | Powder component |
| --- | --- | --- | --- |
| 1 | R1(15) + R2(14.5) | A2(0.5) | P1(70) |
| 2 | R1(28.5) | A3(0.5) | P1(70) |
| 3 | R1(28) + R5(1.5) | A1(0.5) | P1(70) |
| 4 | R1(15) + R4(14.5) | A4(0.5) | P1(70) |
| 5 | R3(28) + R5(1.5) | A5(0.5) | P1(70) |
| 6 | R1(28) | A1(1.0) | P3(71) |
| 7 | R1(83) | A1(3.0) | P2(14) |
| 8 | R1(80) + R5(3.0) | A1(3.0) | P2(14) |

Numerals in parentheses indicate composition ratio (%)

III) Formation of Patterns

Each of the resist solutions prepared in II) was coated on a wafer and dried by baking at 50° C. for 5 minutes to form a resist film. The thickness of the resist film was set at 1 μm for resists 7 and 8 (light-shielding resists), and 15 fm for the other resists. Each resist film was exposed using a high-pressure mercury lamp and baked at 100° C. for 1 minute. Thereafter, the resultant film was washed with hot water at 40° C. for 2 minutes to form a pattern. The sensitivity, i.e., a minimum exposure amount by which pattern formation was possible, and the resolution of each resultant resist are listed in TABLE 3 below.

TABLE 3

| Resist | Sensitivity (mJ/cm$^2$) | Resolution (μm) |
| --- | --- | --- |
| 1 | 30 | 50 |
| 2 | 50 | 50 |
| 3 | 10 | 20 |
| 4 | 60 | 50 |
| 5 | 40 | 20 |
| 6 | 70 | 10 |
| 7 | 280 | 20 |
| 8 | 170 | 40 |

Also, the absorbances at 550 nm of the patterns (film thickness 1 μm) formed by using resists 7 and 8 were measured. The measurement results are shown in TABLE 4 below.

TABLE 4

| Resist | Absorbance in exposed portion | Absorbance in unexposed portion |
| --- | --- | --- |
| 7 | 0.01 | 2.7 |
| 8 | 0.03 | 3.0 |

As is apparent from TABLE 4, resists 7 and 8 have a satisfactory function as a light-shielding resist.

EXAMPLE 2

A pattern having fine pores of 100 μm in diameter on the entire surface was formed using carbon on the inner surface of a CRT. A solution of resist 3 prepared in Example 1 was coated on the resultant pattern to have a film thickness of 15 μm. Exposure was then performed with an exposure amount of 10 mJ through a shadow mask by using a high-pressure mercury lamp as a light source. Thereafter, the resultant material was heated at 80° C. for 1 minute and developed with water, thereby forming a green phosphor pattern in the carbon pores. Subsequently, the same process was repeated by using a resist containing a red fluorescent powder and a resist containing a yellow fluorescent powder, instead of the green fluorescent powder, prepared following the same procedure as in Example 1, thereby forming a light-receiving surface having a repetitive pattern of R, G, and B. Subsequently, the tube was sealed, and aluminum was vapor-deposited on the rear surface. Thereafter, heating, evacuation, and electrode sealing were performed to manufacture a CRT.

The luminance of the CRT thus manufactured was higher by 11% than that of a CRT manufactured by a conventional method using a resist containing polyvinyl alcohol, a fluorescent substance, and ammon dichromate. Additionally, since the sensitivity of the resist was raised, it was possible to form a pattern within an exposure time that was ⅓ of that in the conventional manufacturing method.

EXAMPLE 3

A solution of resist 8 prepared in Example 1 was coated to have a film thickness of 1 μm on an LCD substrate on which an ITO transparent electrode was formed. A pattern corresponding to a peripheral portion (light-shielding portion) of a light-transmitting portion was exposed using light which has a wavelength of 365 nm on the entire surface with an exposure amount of 200 mJ. Thereafter, the resultant film was baked at 90° C. for 2 minutes and developed with water to form a light-shielding pattern on the substrate. Subsequently, cells were assembled by adhering an orientation film and a substrate to the LCD substrate on which the light-shielding pattern was formed. A liquid crystal was sealed in a vacuum, and a polarizing plate was adhered to manufacture a liquid crystal device.

This liquid crystal device can be manufactured without an etching step which is required in the manufacture of a liquid crystal device using a conventional metal light-shielding film of chromium. This accomplishes a reduction in the manufacturing time and cost. Defects in the liquid crystal device manufactured were also reduced.

EXAMPLE 4

50 g (solid content 3.9 g) of a solution prepared by diluting CF Black (manufactured by Mikuni Shikiso K.K.) 3 times by ethylcellosolve acetate, 4 g of a styrene-hydroxystyrene copolymer (3:7), 1 g of a melamine resin (Cymel 325), and 0.5 g of acid generator A3 were mixed, and the mixture was filtered through a 10-μm filter to prepare a resist. Subsequently, the resist was coated to have a thickness of 1.2 μm on a transparent substrate, thereby forming a thin film. The resultant thin film was then exposed by a high-pressure mercury lamp. Thereafter, the thin film was subjected to post exposure baking at 110° C. for 5 minutes and developed with a 0.1 N sodium hydroxide solution.

As a result, a light-shielding pattern with a line width of 20 μm was obtained with an exposure amount of 150 mJ. The residual film ratio was found to be 97%.

EXAMPLE 5

50 g of a solution (solid content 4.7 g) prepared by diluting CF Black (Mikuni Shikiso K.K.) 2.5 times by ethylcellosolve acetate, 4 g of a cresol novolak resin (manufactured by Gunei Kagaku K.K.), 1 g of a melamine resin (Cymel 325), and 1 g of naphthoquinonediazido-5-sulfonester of 2,3,4,4'-hydroxybenzophenone as an acid generator were mixed, and the mixture was filtered through a 10-μm filter to prepare a resist. Subsequently, the resist was coated to have a thickness of 1.0 μm on a transparent substrate, thereby forming a thin film. The resultant thin film was then exposed by a high-pressure mercury lamp. Thereafter, the thin film was subjected to post exposure baking at 120° C. for 5 minutes and developed with a 0.2N sodium hydroxide solution.

As a result, a light-shielding pattern with a line width of 20 μm was obtained with an exposure amount of 200 mJ. The residual film ratio was found to be 95%.

EXAMPLE 6

50 g of a solution (solid content 4.7 g) prepared by diluting CF Black (Mikuni Shikiso K.K.) 2.5 times by ethylcellosolve acetate, 5 g of a copolymer of hydroxystyrene and tert-butoxycarbonyloxystyrene, and 0.5 g of naphthoquinonediazido-4-sulfonester of 2,3,4,4'-hydroxybenzophenone as an acid generator were mixed, and the mixture was filtered through a 10-μm filter to prepare a resist. Subsequently, the resist was coated to have a thickness of 1.0 μm on a transparent substrate, thereby forming a thin film. The resultant thin film was then exposed by a high-pressure mercury lamp. Thereafter, the thin film was subjected to post exposure baking at 110° C. for 5 minutes and developed with a 0.2N sodium hydroxide solution.

As a result, a positive light-shielding pattern with a line width of 20 μm was obtained with an exposure amount of 120 mJ. The residual film ratio was found to be 93%.

EXAMPLE 7

I) Preparation of Resin Components

Resins R1 and R2 synthesized in Example 1 were used as resin components. In addition, resin R3 used in Example 1 and a commercially prepared polyvinyl butyral resin (BL-S, manufactured by Sekisui Chemical Co., Ltd., acetalization degree 70 mol %) were used as comparative resins. Hereinafter, the commercially prepared polyvinyl butyral resin is to be referred to as resin R6.

All of the resins were refined through dissolving in a 2% oxalic acid solution, precipitation with ether, washing, filtration, and reduced-pressure drying.

II) Preparation of Acid Generators

As acid generators, diazonium salts represented by Formulas (3) to (5) and triphenylsulfonium triflate were used. A diazonium salt represented by Formula (3) was purchased from Lespechemical Corp. This salt was identical with acid generator A1 in Example 1. Triphenylsulfonium triflate was purchased from Midori Kagaku K.K. and this salt was identical with acid generator A5 in Example 1. A diazonium salt represented by Formula (4) was prepared by dissolving acid generator A1 in water, adding an excess amount of sulfosalicylic acid to the solution, concentrating and cooling the solution, and removing the precipitated crystal by filtration. This diazonium salt was the same as acid generator A3 in Example 1. A diazonium salt represented by Formula (5) was prepared by using p-ethylbenzenesulfonic acid, instead of sulfosalicylic acid, in the preparation of acid generator A3. Hereinafter, this diazonium salt is to be referred to as acid generator A6.

III) Preparation of Resist Solutions

Seven types of resist solutions were prepared by dissolving solid contents having compositions listed in TABLE 5 below in fourfold amounts of water, and filtering the resultant solutions.

TABLE 5

| Resist No. | Resin symbol and composition ratio (%) | Photo-acid generator and composition ratio (%) |
|---|---|---|
| 1 | R1 (99) | A1 (1) |
| 2 | R1 (99) | A3 (1) |
| 3 | R1 (99) | A6 (1) |
| 4 | R1 (99) | A5 (1) |
| 5 | R2 (99) | A1 (1) |
| Comparative Example 1 | R6 (99) | A1 (1) |
| Comparative Example 2 | R3 (99) | A1 (1) |

IV) Formation of Patterns

Each resist solution prepared in III) was coated on a wafer so as to have a film thickness of 7 μm by using a spin coating method (1,500 rpm). Subsequently, the wafer was baked at 100° C. for 1 minute and subjected to pattern exposure. After the exposure, each resultant wafer was baked at 140° C. for 1 minute and lastly washed with warm water (40° C.) for 2 minutes, thereby forming a pattern.

TABLE 6 below shows the sensitivity of each resist and the resolution of each resultant pattern.

TABLE 6

| Example | Sensitivity (mj/cm$^2$) | Resolution (μm) |
|---|---|---|
| 1 | 10 | 12.5 |
| 2 | 20 | 10.0 |
| 3 | 35 | 7.5 |
| 4 | 60* | 3.0 |
| 5 | 30 | 5.0 |
| Comparative Example 1 | 150 | 20.0 |
| Comparative Example 2 | 200 | 20.0 |

Note that in TABLE 6, the value with symbol * indicates the result obtained by exposure with light having a wavelength of 250 nm, and all other values were obtained by exposure using a high-pressure mercury lamp.

EXAMPLE 8

For each of resins R1, R2, and R6 used in Example 7, an unrefined resin before being subjected to the refining process described in "Preparation of resin components" and a refined resin subjected to the process were prepared. 1 wt % of acid generator A1 was added as an acid generator to each prepared resin, and pattern formation was performed following the same procedure as in Example 7.

The Na ion concentration of each resultant resist was measured. TABLE 7 below summarizes the relationships between the Na ion concentration and the sensitivity.

TABLE 7

| Resin | Na concentration before refining (ppm) | Sensitivity before refining | Na concentration after refining (ppm) | Sensitivity after refining (mj/cm$^2$) |
|---|---|---|---|---|
| R1 | 2500 | Not sensitive | 40 | 10 |
| R2 | 1000 | Not sensitive | 100 | 30 |
| R6 | 1000 | Not sensitive | 130 | 150 |

As can be seen from TABLE 7, none of the unrefined resins functioned as a resist since the Na ion concentration in the resin exceeded 1,000 ppm.

EXAMPLE 9

Resist solutions were prepared by adding 10 wt % of acid generator A1 to resins R1 and R2 prepared in Example 7 and dissolving the resultant mixtures in tenfold amounts of water. Subsequently, each prepared resist solution was coated on a substrate, and pattern exposure was performed. Thereafter, the resultant substrates were baked at 120° C. for 1 minute and developed with water for 2 minutes, thereby forming patterns. These patterns were then blackened by heating in a nitrogen atmosphere at 200° C. for 10 minutes. TABLE 8 below shows the light transmittances (wavelength 550 nm) before and after each pattern was heated.

TABLE 8

| Resin | Transmittance before blackening by heating (%) | Transmittance after blackening by heating (%) |
|---|---|---|
| R1 | 98.2 | 0.5 |
| R2 | 95.4 | <0.1 |

It is evident from TABLE 8 that each pattern blackened by heating can satisfactorily function as a light-shielding layer.

What is claimed is:

1. A slurry photosensitive composition containing:
(i) from 0.01 to 20 parts by weight of an acid generating compound which generates an acid when irradiated with light or ionizing radiation and selected from the group consisting of a (1) quinonediazide compound, (2) an organic halide or (3) an onium salt which is a (3a) diazonium salt selected from the group consisting of:

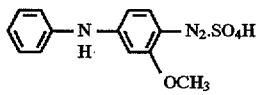

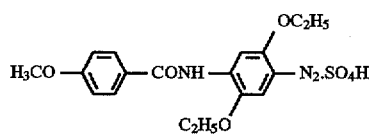

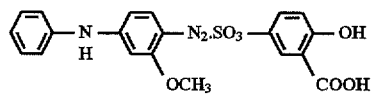

and

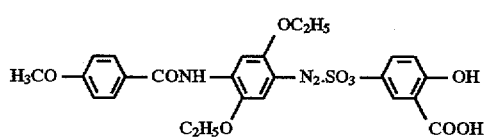

or a (3b) salt of the formula:

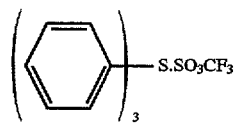

said acid functioning as a catalyst for a crosslinking reaction or a decomposition reaction;
ii) at least one acid-crosslinkable or acid decomposable resin; and
iii) from 14 to 98 parts by weight of a powder.

2. The composition of claim 1, wherein said at least one acid-crosslinkable resin is selected from the group consisting of a homopolymer or copolymer of vinyl alcohol, a copolymer of maleic anhydride, a hydroxy group, COOH group or acetal group containing resin having acid reactivity and a dehydration condensation property, a copolymer of polyamic acid, a polyamino acid or acrylic acid and a vinyl compound having a double bond on a side chain thereof, a methylol group containing melamine resin, an acrylic copolymer having a double bond on a side chain thereof, an acrylic copolymer containing an epoxy group, a polymer having a double bond which is formed of allylether or ethylvinylether, an epoxy resin which is alkali soluble, an acrylic acid or carboxylic acid derivative modified epoxy resin, which is alkali soluble, a phenolic resin and an acetalized polyvinyl alcohol formed of the repeating unit:

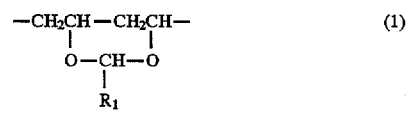

wherein $R_1$ is a monovalent organic group.

3. A composition according to claim 1, wherein said resin is an acetal resin.

4. A composition according to claim 3, wherein said acetal resin has repeating units represented by Formulas (1) and (2) below:

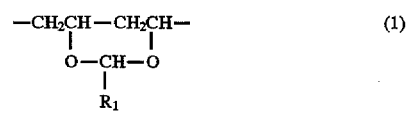

wherein $R_1$ represents a hydrogen atom or a monovalent organic group.

5. A composition according to claim 4, wherein the weight-average molecular weight (Mw) of said acetal resin is 1,000–300,000.

6. A composition according to claim 1, wherein said powder is a fluorescent powder.

7. A composition according to claim 1, wherein said powder is a light-absorbing pigment.

* * * * *